(12) United States Patent
Adam

(10) Patent No.: US 9,063,175 B2
(45) Date of Patent: Jun. 23, 2015

(54) ELECTRIC POWER METERING DEVICE AND METHOD

(75) Inventor: Gèrard Adam, Saint Georges de Commiers (FR)

(73) Assignee: Schneider Electric Industries SAS, Rueil-Malmaison (FR)

(*) Notice: Subject to any disclaimer, the term of this patent is extended or adjusted under 35 U.S.C. 154(b) by 818 days.

(21) Appl. No.: 13/064,409

(22) Filed: Mar. 23, 2011

(65) Prior Publication Data

US 2011/0248730 A1    Oct. 13, 2011

(30) Foreign Application Priority Data

Apr. 13, 2010  (FR) ...................................... 10 01539

(51) Int. Cl.
*G01R 27/08* (2006.01)
*G01R 15/04* (2006.01)
*H03H 7/24* (2006.01)

(52) U.S. Cl.
CPC . *G01R 15/04* (2013.01); *H03H 7/24* (2013.01)

(58) Field of Classification Search
CPC ........ H03H 7/24; G01R 15/06; G01R 15/142; G01R 15/145; G01R 1/203
USPC ....................................................... 324/691
See application file for complete search history.

(56) References Cited

U.S. PATENT DOCUMENTS

| | | | | |
|---|---|---|---|---|
| 3,603,979 A | * | 9/1971 | Kosakowski | 341/119 |
| 4,988,957 A | * | 1/1991 | Thompson et al. | 331/107 A |
| 5,796,296 A | * | 8/1998 | Krzentz | 327/545 |
| 5,883,508 A | * | 3/1999 | Ermisch et al. | 323/359 |
| 6,100,750 A | * | 8/2000 | Van Der Zee | 327/531 |
| 6,380,725 B1 | * | 4/2002 | Chavez et al. | 324/96 |
| 6,909,272 B2 | * | 6/2005 | Bengtsson | 324/126 |
| 2003/0098698 A1 | * | 5/2003 | Bengtsson | 324/644 |
| 2003/0112054 A1 | * | 6/2003 | Yamaguchi et al. | 327/513 |
| 2004/0004179 A1 | * | 1/2004 | Hayami et al. | 250/214 R |
| 2004/0189412 A1 | * | 9/2004 | Kato | 331/158 |
| 2005/0122122 A1 | * | 6/2005 | Yakymyshyn et al. | 324/705 |
| 2005/0264374 A1 | * | 12/2005 | Podell | 333/109 |
| 2006/0012382 A1 | * | 1/2006 | Yakymyshyn et al. | 324/705 |
| 2006/0139094 A1 | * | 6/2006 | Takahashi et al. | 330/133 |
| 2010/0091804 A1 | * | 4/2010 | Musio et al. | 372/20 |
| 2011/0089931 A1 | * | 4/2011 | Podlisk et al. | 324/126 |
| 2011/0109302 A1 | * | 5/2011 | Peretto et al. | 324/123 R |

FOREIGN PATENT DOCUMENTS

| | | |
|---|---|---|
| DE | 1 516 244 | 5/1969 |
| DE | 126 801 | 8/1977 |
| DE | 195 08 582 | 9/1996 |
| DE | 195 37 155 | 4/1997 |
| DE | 198 41 164 | 3/2000 |
| GB | 2 168 495 | 6/1986 |
| JP | 58-178262 | 10/1983 |

* cited by examiner

*Primary Examiner* — Benjamin M Baldridge
(74) *Attorney, Agent, or Firm* — Steptoe & Johnson LLP

(57) ABSTRACT

The measuring device with electric voltage divider comprises a first measuring resistor connected between a voltage measurement input and a common point, and a second measuring resistor connected between said common point and a reference electric ground. A measurement output is connected to the common point. An outer shielding enclosure surrounds the first and second measuring resistors and is connected to the reference electric ground. An inner capacitive electrode surrounding the first and second measuring resistors is arranged inside said outer shielding enclosure. To improve the phase difference and passband, the device comprises a phase difference compensation circuit connected between said inner capacitive electrode and said common point.

8 Claims, 2 Drawing Sheets

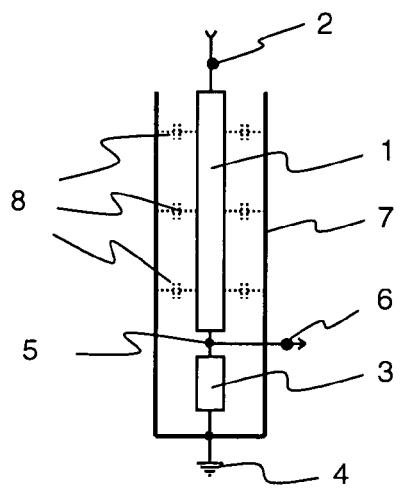
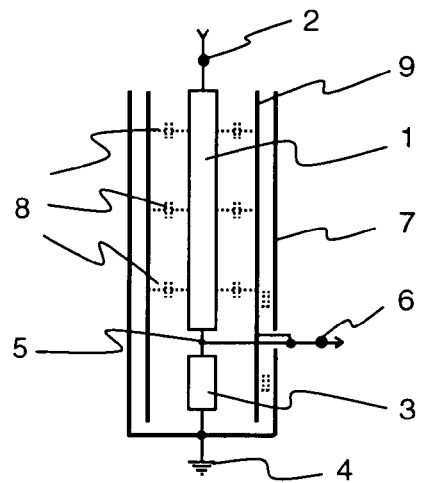
FIG. 1
(Prior Art)
FIG. 2
(Prior Art)
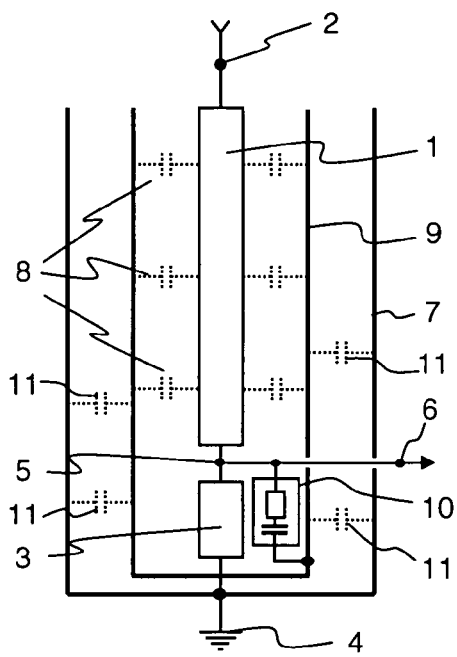
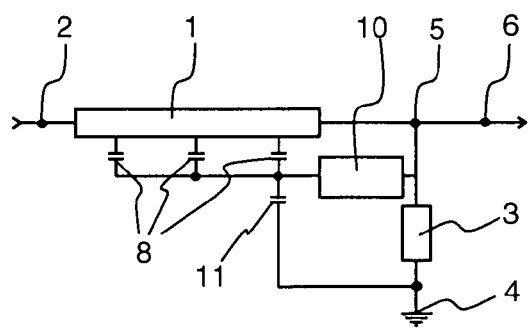
FIG. 3
FIG. 4

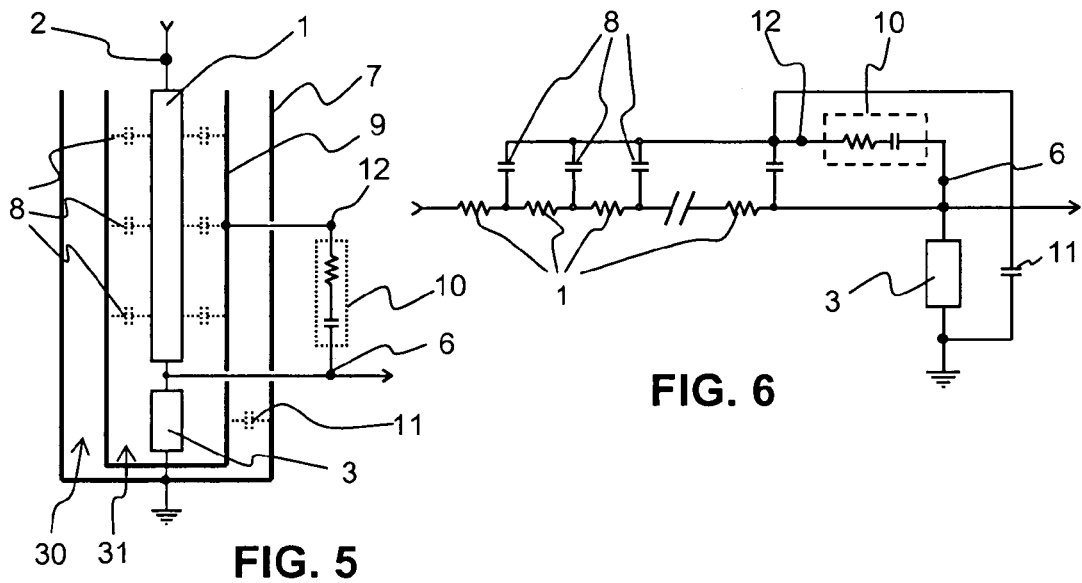
FIG. 5
FIG. 6
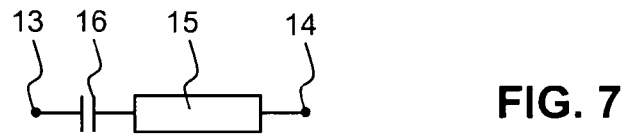
FIG. 7
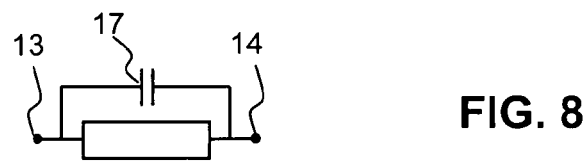
FIG. 8
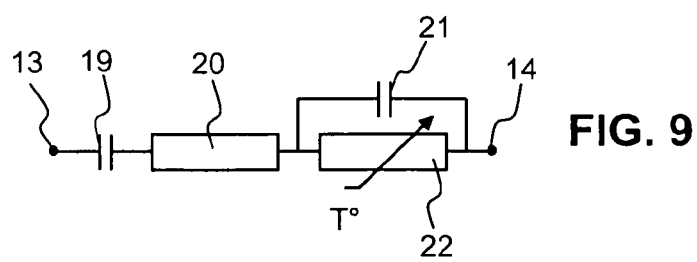
FIG. 9

ELECTRIC POWER METERING DEVICE AND METHOD

BACKGROUND OF THE INVENTION

The invention relates to a measuring device with electric voltage divider comprising:
- a first measuring resistor connected between a voltage measurement input and a common point,
- a second measuring resistor connected between said common point and a reference electric ground,
- a measurement output connected to said common point,
- an outer shielding enclosure surrounding said first and second measuring resistors connected to said reference electric ground, and
- an inner capacitive electrode surrounding said first and second measuring resistors and arranged inside said outer shielding enclosure.

STATE OF THE ART

The known electric medium-voltage or high-voltage measuring devices represented in FIG. 1 comprise a first resistor 1 of high value connected to a high-voltage measurement input 2 and a second foot resistor 3 of low value connected to an electric ground 4. The two resistors are connected to a common point 5 to form a resistive bridge. The common point 5 is connected to a measurement output 6 of the resistive bridge. In known manner, high-voltage resistive dividers are arranged in an outer shielding enclosure 7 surrounding the measuring resistors 1 and 3. In such a layout, stray capacitances 8 appear between the resistor 1 and the grounded outer enclosure. These capacitances are distributed over the length of the resistor 1 and of the outer enclosure 7. The measuring resistor 1 and capacitances 8 thereby form a distributed low-pass filter. Such a filter generates a phase difference of the output signal with respect to the input voltage signal and attenuates the high frequencies of the signal, in particular the harmonic components.

Other devices represented in FIG. 2 comprise an inner capacitive electrode 9 surrounding measuring resistances 1 and 3. This electrode, generally arranged inside the outer shielding enclosure 7, is connected to the measurement output 6. Such a device is described in Patent application DE19841164.

Devices comprising an inner capacitive electrode have an improved phase difference. However, the phase difference is still too high to use these devices in electric power measuring systems. Furthermore, with these devices, measurement of signals containing high-level harmonic components is not sufficiently precise.

SUMMARY OF THE INVENTION

The object of the invention is to provide a measuring device with a voltage divider having a reduced phase difference enabling high-level harmonic signals to be measured and having a low phase difference drift with temperature.

The measuring device with electric voltage divider according to the invention comprising:
- a first measuring resistor connected between a voltage measurement input and a common point,
- a second measuring resistor connected between said common point and a reference electric ground,
- a measurement output connected to said common point,
- an outer shielding enclosure surrounding said first and second measuring resistors connected to said reference electric ground, and
- an inner capacitive electrode surrounding said first and second measuring resistors and arranged inside said outer shielding enclosure, comprises a phase difference compensation circuit connected between said inner capacitive electrode and said common point.

In a preferred embodiment, the compensation circuit is a two-terminal circuit with two input-outputs. The compensation circuit is preferably a phase lead circuit. The compensation circuit preferably comprises at least one resistor and one capacitor. The compensation circuit preferably comprises at least one electronic component having an electric quantity that is variable with temperature.

According to a first alternative embodiment, the compensation circuit is arranged inside said inner capacitive electrode.

According to a second alternative embodiment, said inner capacitive electrode is connected to a compensation output and the circuit compensation is connected between said compensation output and said measurement output.

The first measuring resistor preferably has a resistance value of more than 50 megohms.

In a particular embodiment, the device comprises:
- a first insulating layer between said outer shielding enclosure and said inner capacitive electrode, and
- a second insulating layer between said inner capacitive electrode and said first measuring resistor, the first and second insulating layer having substantially identical variations of the dielectric characteristics with temperature.

BRIEF DESCRIPTION OF THE DRAWINGS

Other advantages and features will become more clearly apparent from the following description of particular embodiments of the invention given for non-restrictive example purposes only and represented in the appended drawings in which the reference numbers deonte like elements throughout the various figures:

FIGS. 1 and 2 represent resistive-bridge measuring devices of the state of the technique;

FIG. 3 represents a measuring device according to a first embodiment of the invention;

FIG. 4 represents a first modelling diagram of a device according to an embodiment of the invention;

FIG. 5 represents a measuring device according to a second embodiment of the invention;

FIG. 6 represents a second modelling diagram of a device according to an embodiment of the invention;

FIGS. 7 to 9 represent diagrams of compensation circuits used in devices according to the invention.

DETAILED DESCRIPTION OF PREFERRED EMBODIMENTS

FIG. 3 represents a measuring device with electric voltage divider comprising a first measuring resistor 1 connected between a voltage measurement input 2 and a common point 5, a second measuring resistor 3 connected between said common point 5 and a reference electric ground 4, and a measurement output 6 connected to said common point. The device also comprises an outer shielding enclosure 7 surrounding the first and second measuring resistors 1 and 3 and connected to said reference electric ground 4. The enclosure 7 protects the resistors against electromagnetic and electrostatic disturbances external to the device. An inner capacitive compensation electrode 9 surrounding said first and second measuring resistors 1 and 3 is arranged inside said outer shielding enclosure. It enables signals collected by the capacitive connection with the resistors to be conveyed to the output signal.

According to the invention, the device comprises a phase difference compensation circuit 10 connected between said inner capacitive compensation electrode 9 and said common point 5. The compensation circuit 9 comprises electronic components which perform precise compensation of the phase difference between the output signal on output 6 and the high-voltage input signal on input 2. The compensation circuit also enables almost constant attenuation of the signal to be guaranteed over a passband of the signal to be measured so as to measure high-level harmonic components. The passband signal to be measured should for example preferably be between the fundamental frequency and harmonic thirteen (level 13).

In the embodiment of FIG. 3, the compensation circuit 10 is arranged inside the inner capacitive electrode 9. The circuit 10 is in the form of a printed circuit comprising the electronic components.

FIG. 4 represents a first modelling diagram of a device according to an embodiment of the invention. The resistors 1 and 3 form a resistive divider bridge, the distributed capacitors 8 between resistor 1 and the inner capacitive electrode 9 on the one hand and distributed capacitors 11 between the inner capacitive electrode 9 and the outer enclosure 7 form a capacitive divider. The compensation circuit 10 is connected between the capacitive divider and the resistive divider so as to optimize or reduce the phase difference conjointly with the increase of the passband of the device.

In the embodiment of FIG. 5, the inner capacitive electrode 9 is connected to a compensation output 12 and the compensation circuit 10 is connected between the compensation output 12 and the measurement output 6. The circuit 10 is in the form of a printed circuit comprising the electronic components in a case located outside the outer enclosure 7.

FIG. 6 represents a second modelling diagram of a device according to an embodiment of the invention. In this diagram, the distributed resistor 1 and the distributed capacitors 8 are represented by a succession of resistance-capacitor (RC) filters.

The compensation circuit is preferably a two-terminal circuit with two input-outputs 13 and 14 as represented in FIGS. 7, 8 and 9. The compensation circuit is in most cases a phase lead circuit. However, this phase difference can be adjusted according to the phase difference of other measuring circuits. For example, it will be adjusted according to the phase difference undergone by an associated current measuring circuit in the scope of measurement of active or reactive power or of a power factor of an installation.

In simplified versions, the compensation circuit comprises a resistor 15 connected in series with a capacitor 16 as in FIG. 7, or a capacitor 17 and a resistor 18 connected in parallel as in FIG. 8.

The layers of dielectric materials arranged between the resistor 1 and the inner capacitive electrode 9 and between said inner capacitive electrode and the outer enclosure 7 can have dielectric characteristics which vary according to the temperature. The values of capacitors 8 and 11 thereby also vary according to the temperature. Such variations have effects on the phase difference and on the passband. To limit these effects, the device according to an embodiment of the invention comprises a first insulating layer 30 between said outer shielding enclosure and said inner capacitive electrode and a second insulating layer 31 between said inner capacitive electrode and said first measuring resistor made with materials having substantially identical variations of the dielectric characteristics according to the temperature. The material is advantageously identical for the two layers.

To improve compensation according to the temperature, the compensation circuit 10 comprises at least one electronic component having an electric quantity that is variable with temperature. In FIG. 9, the compensation circuit is complex. It comprises a first capacitor 19 connected in series with a resistor 20 and in series with a parallel RC cell comprising a capacitor 21 and a resistor 22 having a variable value according to the temperature. The temperature coefficient of the resistor 22 can be positive (PTC) or negative (NTC).

The compensation circuit described above enables a voltage measuring device to be achieved having resistors 1 of very high value. The measuring resistor 1 advantageously has a value of more than 50 megohms (MΩ). The high resistance values enable the electric power dissipated in the measuring devices to be limited thereby enabling the volume of the devices to be reduced.

The devices described in the foregoing are particularly suitable for medium voltage, high voltage or extra high voltage measurement, for example from 1,000 volts to 100,000 volts.

The invention claimed is:

1. An electrical measuring device having an electric voltage divider, comprising:
    a first measuring resistor connected between a voltage measurement input point and a common point,
    a second measuring resistor connected between said common point and a reference electrical ground,
    a measurement output point connected to said common point,
    an outer shielding enclosure surrounding said first and second measuring resistors and connected to said reference electrical ground,
    an inner capacitive electrode surrounding said first and second measuring resistors and arranged inside said outer shielding enclosure, and
    a phase difference compensation circuit connected between said inner capacitive electrode and said common point, wherein the compensation circuit comprises at least one electronic component having a temperature dependent variable electric quantity.

2. The device according to claim 1 wherein the compensation circuit is a two-terminal circuit with two input-output points.

3. The device according to claim 1 wherein the compensation circuit is a phase lead circuit.

4. The device according to claim 1 wherein the compensation circuit comprises at least one resistor and one capacitor.

5. The device according to claim 1 wherein said inner capacitive electrode also surrounds the compensation circuit.

6. The device according to claim 1 wherein said inner capacitive electrode is connected to a compensation output point, and the compensation circuit is connected between said compensation output point and said measurement output point.

7. The device according to claim 1 wherein the first measuring resistor has a value of more than 50 megohms.

8. The device according to claim 1 comprising: a first insulating layer between said outer shielding enclosure and said inner capacitive electrode, and a second insulating layer between said inner capacitive electrode and said first measuring resistor, the first and second insulating layer having substantially identical temperature dependent dielectric characteristics.

* * * * *